United States Patent
Kudou

(10) Patent No.: US 9,269,765 B2
(45) Date of Patent: Feb. 23, 2016

(54) SEMICONDUCTOR DEVICE HAVING GATE WIRE DISPOSED ON ROUGHENED FIELD INSULATING FILM

(71) Applicant: Panasonic Intellectual Property Management Co., Ltd., Osaka (JP)

(72) Inventor: Chiaki Kudou, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/510,125

(22) Filed: Oct. 9, 2014

(65) Prior Publication Data
US 2015/0108503 A1    Apr. 23, 2015

(30) Foreign Application Priority Data

Oct. 21, 2013   (JP) .................. 2013-218094

(51) Int. Cl.
*H01L 29/06*   (2006.01)
*H01L 29/423*  (2006.01)
*H01L 29/16*   (2006.01)
*H01L 29/51*   (2006.01)
*H01L 29/49*   (2006.01)
*H01L 21/321*  (2006.01)
*H01L 21/3213* (2006.01)

(52) U.S. Cl.
CPC ...... *H01L 29/0611* (2013.01); *H01L 21/32105* (2013.01); *H01L 21/32134* (2013.01); *H01L 21/32139* (2013.01); *H01L 29/1608* (2013.01); *H01L 29/42364* (2013.01); *H01L 29/4916* (2013.01); *H01L 29/51* (2013.01)

(58) Field of Classification Search
CPC .............. H01L 29/45; H01L 29/66068; H01L 29/7802; H01L 29/7811; H01L 29/7845; H01L 29/1608; H01L 29/7816; H01L 29/0611; H01L 21/02532; H01L 21/02238; H01L 29/51; H01L 21/02595; H01L 29/4916; H01L 21/31111; H01L 21/02164; H01L 29/42364
See application file for complete search history.

(56) References Cited

U.S. PATENT DOCUMENTS

| | | | |
|---|---|---|---|
| 5,290,729 | A | 3/1994 | Hayashide et al. |
| 5,858,860 | A | 1/1999 | Shim et al. |
| 5,940,721 | A | 8/1999 | Kinzer et al. |
| 6,261,971 | B1 | 7/2001 | Maekawa et al. |

(Continued)

FOREIGN PATENT DOCUMENTS

| | | |
|---|---|---|
| JP | 57-062542 | 4/1982 |
| JP | 57-072342 | 5/1982 |
| JP | 58-017619 | 2/1983 |
| JP | 01-289165 | 11/1989 |
| JP | 03-263370 | 11/1991 |
| JP | 04-000739 | 1/1992 |

(Continued)

*Primary Examiner* — Ermias Woldegeorgis
(74) *Attorney, Agent, or Firm* — McDermott Will & Emery LLP

(57) ABSTRACT

A semiconductor device of the present disclosure includes a semiconductor layer provided on a main surface of a substrate. A cell region is provided with a gate insulating film disposed on the semiconductor layer and a gate electrode disposed on the gate insulating film, and a wiring region is provided with a field insulating film disposed on the semiconductor layer and a gate wire disposed on the field insulating film. An end of the field insulating film has a convex shape in a cross section perpendicular to the main surface of the substrate, and an upper surface of the field insulating film is rougher than an upper surface of a portion of the gate wire below which the field insulating film is not disposed.

9 Claims, 13 Drawing Sheets

(56) References Cited

U.S. PATENT DOCUMENTS

| | | |
|---|---|---|
| 2001/0046729 A1 | 11/2001 | Maekawa et al. |
| 2002/0052102 A1 | 5/2002 | Kiritani |
| 2003/0107041 A1* | 6/2003 | Tanimoto et al. ............... 257/77 |
| 2008/0227256 A1* | 9/2008 | Tanimoto ..................... 438/285 |
| 2012/0205669 A1* | 8/2012 | Miura et al. .................... 257/77 |
| 2013/0020587 A1* | 1/2013 | Hino et al. ..................... 257/77 |
| 2013/0181252 A1* | 7/2013 | Eguchi et al. ................. 257/109 |
| 2015/0263115 A1 | 9/2015 | Hiyoshi et al. |

FOREIGN PATENT DOCUMENTS

| | | |
|---|---|---|
| JP | 9-172175 | 6/1997 |
| JP | 11-330478 | 11/1999 |
| JP | 2000-277514 | 10/2000 |
| JP | 2000-299373 | 10/2000 |
| JP | 2002-075984 | 3/2002 |
| JP | 2006-128407 | 5/2006 |
| JP | 3998288 | 10/2007 |
| JP | 2014-107419 | 6/2014 |

* cited by examiner

SEMICONDUCTOR DEVICE HAVING GATE WIRE DISPOSED ON ROUGHENED FIELD INSULATING FILM

This application claims priority to Japanese Patent Application. No. 2013-218094, filed on Oct. 21, 2013, the contents of which are hereby incorporated by reference.

BACKGROUND

1. Technical Field

The present disclosure relates to a semiconductor device and a method for manufacturing the same.

2. Description of the Related Art

From the viewpoint of stringency of power supply and global environmental protection, power semiconductor devices which can decrease power loss have recently attracted attention, and many development examples have been reported and put into practical use. In power semiconductor devices, a high voltage is applied between a gate electrode and a semiconductor substrate. Gate electrode wiring is not only used for active elements but also used as wiring for applying potential to gate electrodes. With respect to active elements, efforts are made to improve breakdown voltage by forming a depletion layer according to a proper design of a structure of a semiconductor substrate. On the other hand, a portion used as wiring requires a wide area for forming contact with upper-layer wiring and decreasing wiring resistance, thereby causing difficulty of countermeasure on the semiconductor substrate side. In these semiconductor devices, breakdown voltage is secured by forming a thick field insulating film between a gate wire and a semiconductor substrate as disclosed in, for example, Japanese Patent No. 3998288 and Japanese Unexamined Patent Application Publication Nos. 2006-128407 and 57-62542.

A LOCOS (Local Oxidation of Silicon) method is known as a general method for forming field insulating film.

SUMMARY

However, a general method for forming a field insulating film has the following problem.

In the LOCOS method, in view of the characteristics of the production method, a shape referred to as a "bird's beak" is formed at an end of a field insulating film. That is, the field insulating film has a concave-shaped end. Therefore, when a gate wire is formed on the field insulating film, an end of the field insulating film functions as a concave mirror in a lithographic process, and thus thinning of a gate wiring pattern occurs due to the mirror effect.

According to an aspect of the disclosure, there is provided a semiconductor device including a field insulating film provided between a gate wire and a substrate, wherein thinning of a gate wire pattern at an end of the field insulating film can be suppressed.

According to an embodiment of the present disclosure, a semiconductor device includes a substrate on which a cell region and a wiring region are defined, a semiconductor layer disposed on a main surface of the substrate, a gate insulating film disposed on the semiconductor layer in the cell region, a gate electrode disposed on the gate insulating film, a field insulating film disposed on the semiconductor layer in the wiring region, and a gate wire partially disposed on the field insulating film and electrically connected to the gate electrode. The field insulating film is thicker than the gate insulating film and has a convex-shaped end in a cross section perpendicular to the main surface of the substrate. An upper surface of the field insulating film is rougher than an upper surface of a portion of the gate wire below which the field insulating film is not disposed.

According to an embodiment of the present disclosure, a method for manufacturing a semiconductor device includes a step of preparing a substrate having a semiconductor layer provided on a main surface thereof, a step of forming a silicon material composed of polysilicon or amorphous silicon on the semiconductor layer, a step of forming a mask on the formed silicon material, a step of etching the silicon material by isotropic etching using the mask, a step of forming a field insulating film on the semiconductor layer by oxidizing the silicon material at a temperature of 1100° C. or more after removing the mask, and a step of forming a gate wire on the field insulating film.

These inclusive or specific embodiments may be realized by a system or a method, or realized by desired combination of a system, an apparatus, and a method.

According to a technique disclosed in the specification, it is possible to realize a semiconductor device including a field insulating film provided between a gate wire and a substrate, wherein thinning of a gate wire pattern at an end of the field insulating film is suppressed.

Additional benefits and advantages of the disclosed embodiments will be apparent from the specification and Figures. The benefits and/or advantages may be individually provided by the various embodiments and features of the specification and Figures, and need not all be provided in order to obtain one or more of the same.

DETAILED DESCRIPTION

Figure 1:
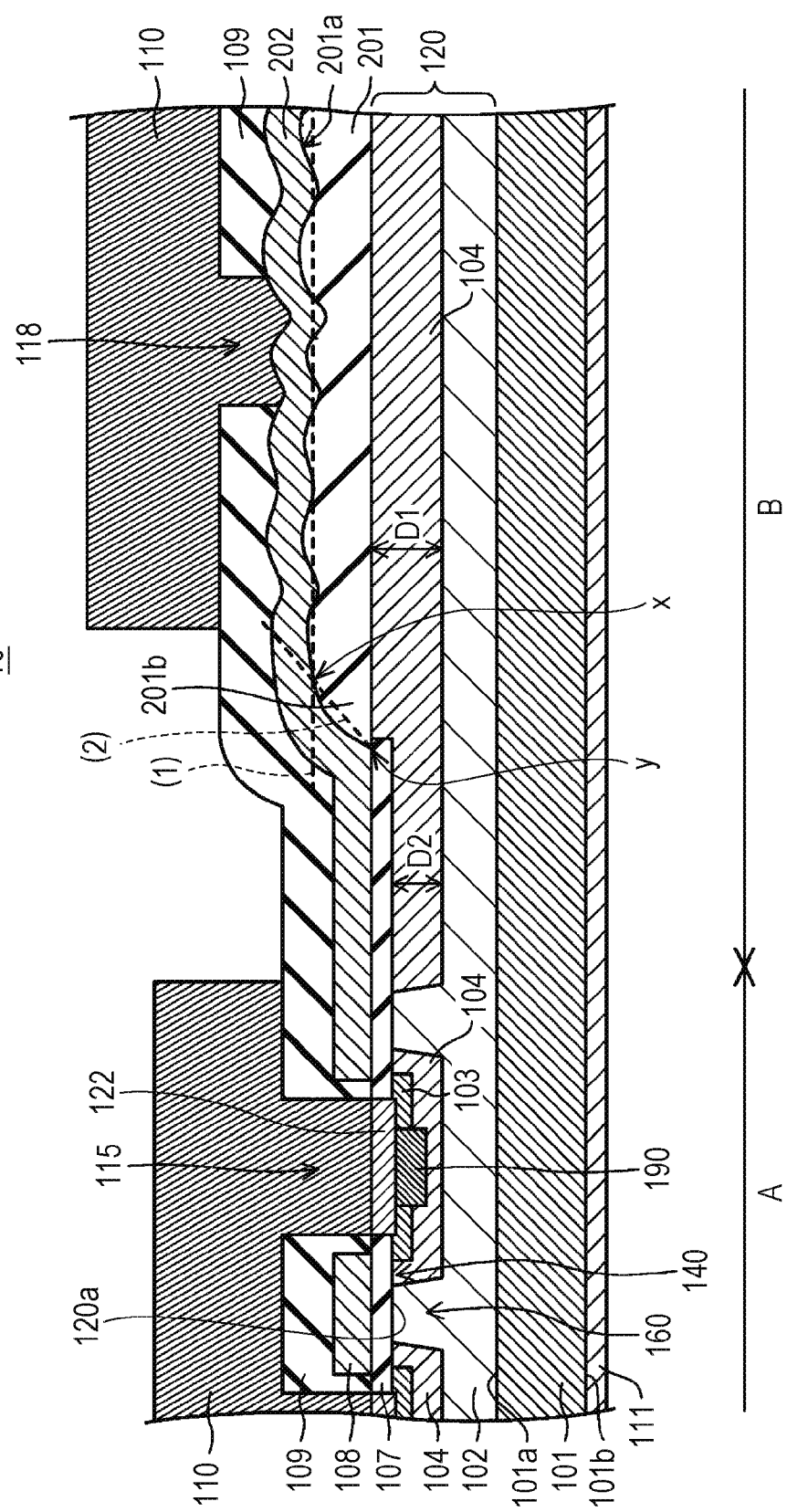
FIG. 1 is a cross sectional view illustrating a configuration of a semiconductor device according an embodiment.

According to a first embodiment of the present disclosure, a semiconductor device includes a substrate on which a cell region and a wiring region are defined, a semiconductor layer disposed on a main surface of the substrate, a gate insulating film disposed on the semiconductor layer in the cell region, a gate electrode disposed on the gate insulating film, a field insulating film disposed on the semiconductor layer in the wiring region, and a gate wire partially disposed on the field insulating film and electrically connected to the gate electrode. The field insulating film is thicker than the gate insulating film. An end of the field insulating film has a convex shape in a cross section perpendicular to the main surface of the substrate. An upper surface of the field insulating film is rougher than an upper surface of a portion of the gate wire below which the field insulating film is not disposed.

According to the embodiment, the field insulating film has a convex-shaped end in a cross section perpendicular to the main surface of the substrate, and thus thinning of a gate wire pattern formed on the field insulating film can be suppressed. Therefore, the gate wire can be formed with good controllability.

Also, according to the embodiment, the field insulating film has the rough upper surface, and thus adhesion between the field insulating film and the gate wire can be improved. In addition, stress due to probing and bonding can be dispersed in a gate pad region, and thus a breakdown of the field insulating film can be suppressed.

According to a second embodiment of the present disclosure, in the semiconductor device of the first embodiment, the upper surface of the field insulating film has a centerline average roughness within a range of 0.025 µm to 0.1 µm.

According to this embodiment, adhesion between the field insulating film and the gate wire can be securely improved. In addition, stress due to probing and bonding can be dispersed in the gate pad region, and thus a breakdown of the field insulating film can be securely suppressed.

According to a third embodiment of the present disclosure, in the semiconductor device of the first embodiment, the field insulating film includes a first insulating film disposed on the semiconductor layer and composed of polysilicon, and a second insulating film disposed on the first insulating film and composed of silicon oxide.

According to this embodiment, stress due to probing and bonding can be further dispersed in the gate pad region, and thus a breakdown of the field insulating film can be suppressed.

According to a fourth embodiment of the present disclosure, in the semiconductor device of the first embodiment, in a cross section perpendicular to the main surface of the substrate, an angle formed by the upper surface of the semiconductor layer and a tangent line to the upper surface of the field insulating film at a point where the upper surface of the field insulating film is in contact with the semiconductor layer is 80° or more and less than 90°, and an angle formed by a center line of the upper surface of the field insulating film and a tangent line to the upper surface of the field insulating film at a point were the upper surface of the field insulating film in the end of the field insulating film crosses the center line is 5° or more and 30° or less.

According to this embodiment, thinning of a gate wire pattern can be securely suppressed.

According to a fifth embodiment of the present disclosure, in the semiconductor device of the first embodiment, the gate electrode and the gate wire are composed of polysilicon.

According to a sixth embodiment of the present disclosure, in the semiconductor device of the first embodiment, the semiconductor layer is composed of silicon carbide.

According to a seventh embodiment of the present disclosure, in the semiconductor device of the first embodiment, the thickness of the field insulating film is 3 to 6 times more than the thickness of the gate insulating film.

According to an eighth embodiment of the present disclosure, in the semiconductor device of the third embodiment, the thickness of the second insulting film of the field insulating film is 4 to 6 times more than the thickness of the gate insulating film.

According to a ninth embodiment of the present disclosure, in the semiconductor device of the first embodiment, the semiconductor layer includes, in the wiring region, a first impurity region of a first conductivity type and a second impurity region of a second conductivity type disposed on the first impurity region, the gate insulating film is disposed between the second impurity region and the portion of the gate wire below which the field insulating film is not disposed, and in a cross section perpendicular to the main surface of the substrate, the thickness D1 of the second impurity region below the field insulating film and the thickness D2 of the second impurity region below the gate insulating film have the relationship of D1<D2.

According to this embodiment, the second impurity region disposed below the field insulating film is decreased in sheet resistance, and thus potential drop due to a current at turning-off can be decreased, and a breakdown of the gate insulating film can be suppressed.

According to a tenth embodiment of the present disclosure, a method for manufacturing a semiconductor device includes a step of preparing a substrate having a semiconductor layer provided on a main surface, a step of forming a silicon material composed of polysilicon or amorphous silicon on the semiconductor layer, a step of forming a mask on the formed silicon material, a step of etching the silicon material by isotropic etching using the mask, a step of forming a field insulating film on the semiconductor layer by oxidizing the silicon material at a temperature of 1100° C. or more after removing the mask, and a step of forming a gate wire on the field insulating film.

According to this embodiment, a semiconductor device including the field insulating film which has a convex-shaped end in a cross section perpendicular to the main surface of the substrate can be manufactured.

According to an eleventh embodiment of the present disclosure, in the method for manufacturing a semiconductor device according to the tenth embodiment, in the step of forming the field insulating film, a portion of the silicon material is allowed to remain unoxidized on the semiconductor layer.

In this embodiment, the field insulating film including a first insulating film composed of polysilicon and a second insulating film composed of silicon oxide can be formed.

According to a twelfth embodiment of the present disclosure, in the method for manufacturing a semiconductor device according to the tenth embodiment, the semiconductor layer is composed of silicon carbide, and when the silicon material is oxidized in the step of forming the field insulating film, an exposed portion of the semiconductor layer is oxidized to form the gate insulating film on the semiconductor layer.

According to a thirteenth embodiment of the present disclosure, in the method for manufacturing a semiconductor device according to the twelfth embodiment, the filed insulating film is thicker than the gate insulating film, an end of the field insulating film has a convex shape in a cross section perpendicular to the main surface of the substrate, and the upper surface of the field insulating film is rougher than the upper surface of a portion of the gate wire below which the field insulating film is not disposed.

Since a LOCOS method includes oxidizing a semiconductor substrate, it is very difficult to apply the LOCOS method to a hardly oxidizable material such as silicon carbide (SiC). For example, in oxidation at 950° C. in a dry oxygen atmosphere, which is generally used for silicon materials, silicon carbide has an oxidation rate of 20 nm/h which is about ⅙ the oxidation rate of a silicon material, even in a (000-1) C plane having a high oxidation rate, and has an oxidation rate of 5 nm/h which is about ¹⁄₂₅ the oxidation rate of a silicon material, in a (0001) Si plane having a low oxidation rate. These ratios are not much changed even with an increase in temperature, and thus it is very difficult to form a thick oxide film of silicon carbide.

General methods, other than the LOCOS method, for forming a field insulating film include a STI (Shallow Trench Isolation) method and a deposited film forming method. The STI method is very complicated and requires a high-cost production method, thereby inevitably increasing the cost. Further, a trench in a fine pattern can be easily planarized, but particular consideration is required for a large area region.

In the deposited film forming method, a pattern is formed by etching a deposited film. When anisotropic etching is used, an end has a structure close to a vertical structure, thereby causing difficulty in subsequently forming the gate wire. This causes wire leakage due to etching residue and the occurrence of an increase in parasitic capacity and particles. Like in the LOCOS method, when isotropic etching is used, a concave-shaped end is formed, and thus the same problem as described above occurs.

In a general method for forming a field insulating film, a plane oxide film is formed on the upper surface of the field insulating film. The plane oxide film causes the following two problems: One of the problems is decrease in adhesion to the gate wire. In particular, when long and thin wiring is formed, the gate wire may be peeled due to stress during the process. The other problem is deterioration in stress resistance. When the gate wire is applied to a region below a bonding pad, the field insulating film may be cracked due to stress during probing and bonding.

In addition, as a problem during an operation, a current at turning-off of a MOS transistor flows through a body region below the gate wire, thereby causing a potential difference due to voltage drop. The potential difference causes a large electric field to be applied to the gate oxide film, and thus the gate oxide film may be broken.

On the other hand, in a semiconductor device and a method for manufacturing the same according to an embodiment of the present disclosure, an end of a field insulating film disposed below a gate wire has a convex shape in a cross section perpendicular to a main surface of a substrate, and thus thinning of a gate wire pattern on the end of the field insulating film can be suppressed. In a semiconductor device and a method for manufacturing the same according to another embodiment of the present disclosure, afield insulating film having an upper surface with irregularities can be formed, thereby improving adhesion to a gate wire and diffusing bonding stress. In a semiconductor device and a method for manufacturing the same according to a further embodiment of the present disclosure, in the step of forming a gate insulating film, an amount of oxidation of a semiconductor layer below a field insulating film can be decreased, thereby decreasing the resistance of a body region which is a second impurity region of a second conductivity type. Therefore, improvement in yield and reliability of a semiconductor device can be realized.

Here, description is made of an example in which a semiconductor layer is a silicon carbide semiconductor layer composed of silicon carbide, and a field insulating film is disposed on the silicon carbide semiconductor layer. The semiconductor layer is not limited to a silicon carbide layer and may be a semiconductor layer such as silicon or the like.

The silicon carbide semiconductor layer is not limited to a silicon carbide semiconductor layer formed by crystal growth on a main surface of a substrate, and includes a substrate composed of a silicon carbide semiconductor and used as a semiconductor. The substrate on which the silicon carbide layer is formed by crystal growth is not limited to a silicon carbide substrate and may be a semiconductor substrate of silicon or the like, or an insulating substrate of sapphire or the like as long as the silicon carbide semiconductor layer can be formed thereon.

Embodiment

A semiconductor device according to an embodiment is, for example, a power semiconductor device composed of silicon carbide (SiC) semiconductor and is suitably used for high-breakdown voltage, large-current, and high-speed operation. A specific example of a configuration of the semiconductor device according to the embodiment is described below.

FIG. 1 shows a cross sectional configuration of a semiconductor device 10 according to an embodiment. The semiconductor device 10 includes an n-type semiconductor substrate 101 having a main surface 101a and a back surface 101b and including silicon carbide. A cell region A and a wiring region B are provided on the main surface 101a of the semiconductor substrate 101. In the cell region A, a MOS (Metal Oxide Semiconductor) structure operating as a transistor is disposed, and in the wiring region B, wiring is disposed so as to be electrically connected to a gate electrode of the transistor. An n-type semiconductor layer 120 having a lower impurity concentration than the semiconductor substrate 101 is provided on the main surface 101a of the semiconductor substrate 101. The semiconductor layer 120 is composed of silicon carbide.

In the cell region A, a p-type first region 104 functioning as a body region is selectively provided in the semiconductor layer 120, and an n-type second region 103 functioning as a source region is provided in the first region 104. The second region 103 has a higher n-type impurity concentration than an n-type impurity concentration in the semiconductor substrate 101. In the semiconductor layer 120, a region other than the first region 104 serves as a drift region 102. Therefore, the drift region 102 has a lower n-type impurity concentration than the n-type impurity concentration in the semiconductor substrate 101. A portion of the drift region 102, which is disposed between adjacent first regions 104, is referred to as a "JFET (Junction Field-Effect Transistor) region 160". In the specification, the drift region 102 corresponds to a first impurity region of a first conductivity type, and the first region 104 corresponds to a second impurity region of a second conductivity type.

The first region 104 is provided to a predetermined depth from the upper surface 120a of the semiconductor layer 120, and in the first region 104, the second region 103 is provided to a predetermined depth from the upper surface 120a. The first region 104 and the second region 103 are exposed in the upper surface 120a. A p-type contact region 190 is provided in the first region 104. A first ohmic electrode 122 is provided on the contact region 190.

A gate insulating film 107 is provided in direct contact with the upper surfaces of a current path region 140 and the JFET region 160. The current path region 140 is a portion between the second region 103 and the JFET region 160 in the first region 104 and functions as an inversion type channel. A gate electrode 108 is provided on the gate insulating film 107.

An interlayer insulating layer 109 is provided so as to cover the upper surface 120a of the semiconductor layer 120, and a contact hole 115 is provided so as to expose the first ohmic electrode 122. Wiring 110 is provided in the contact hole 115 so as to be in contact with the first ohmic electrode 122 and electrically connected to the first ohmic electrode 122. A second ohmic electrode 111 is provided on the back surface 101b of the semiconductor substrate 101. In the semiconductor device according to the embodiment, the first ohmic electrode 122 functions as a source electrode, and the second ohmic electrode 111 functions as a drain electrode.

On the other hand, in the wiring region B, the first region 104 is provided to a predetermined depth from the upper surface 120a of the semiconductor layer 120, and a field insulating film 201 is provided on the first region 104. The thickness of the field insulating film 201 is set within a range of 3 to 6 times the thickness of the gate insulating film 107.

In addition, a gate wire 202 extends from on the gate insulating film 107 to the upper surface 201a of the field insulating film 201. The gate wire 202 is made of the same material as the gate electrode 108 in the cell region A and is electrically connected to the gate electrode 108 as described below. The interlayer insulating layer 109 is provided so as to cover the upper surface 120a of the semiconductor layer 120 and a contact hole 118 is provided so as to expose the gate wire 202. The wiring 110 is provided in the contact hole 118 so as to be in contact with the gate wire 202 and to be electrically connected to the gate wire 202.

Figure 2:
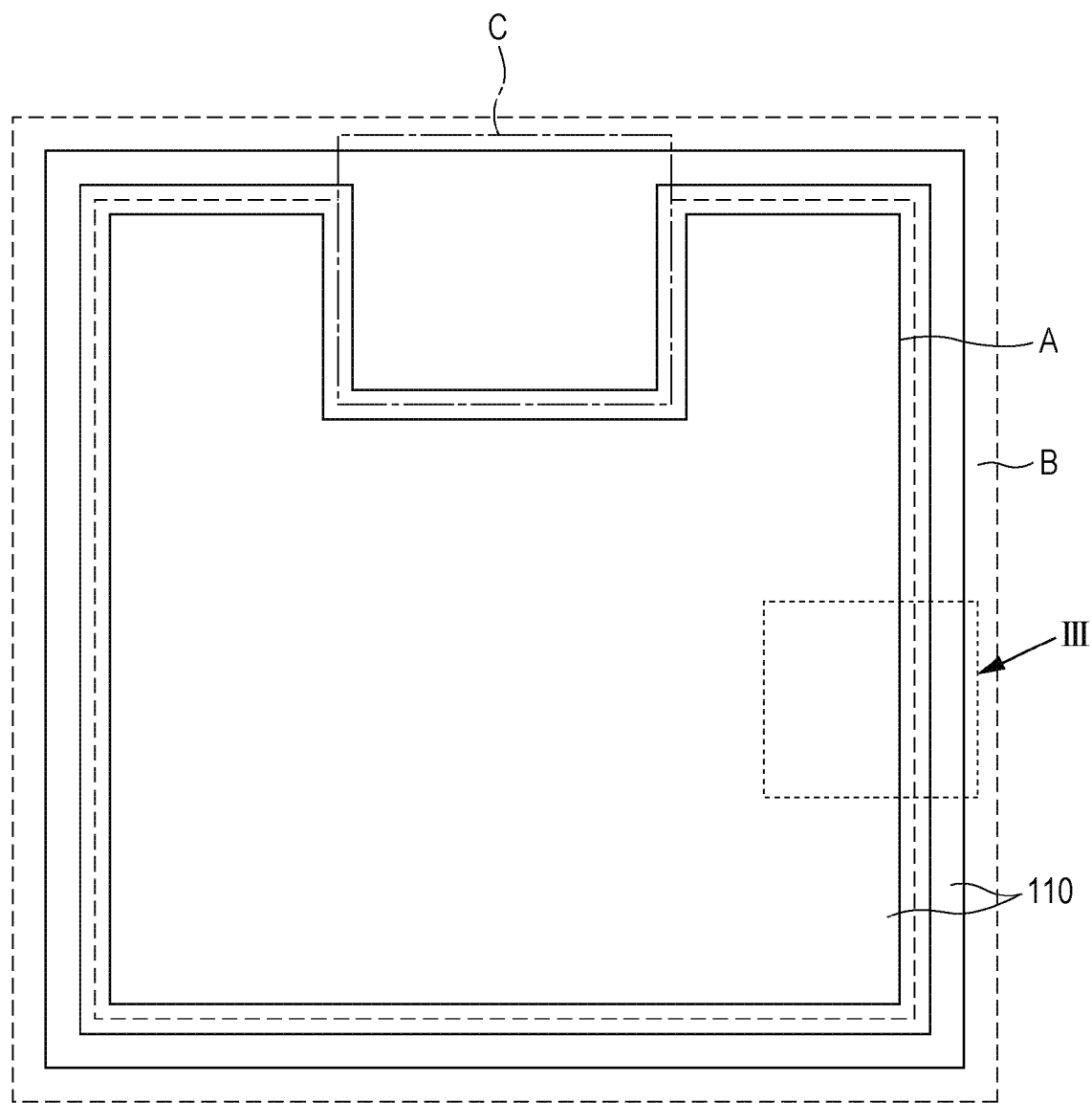
FIG. 2 is a plan view illustrating a configuration of a semiconductor device according an embodiment.

FIG. 2 is a schematic plan view of the semiconductor device 10. The wiring region B surrounds the cell region A. A gate pad region C in which the gate wire 202 and the wiring 110 are enlarged is formed in a portion of the wiring region B. The potential of the gate electrode 108 is controlled by probing and bonding in the gate pad region C.

Figure 3A:
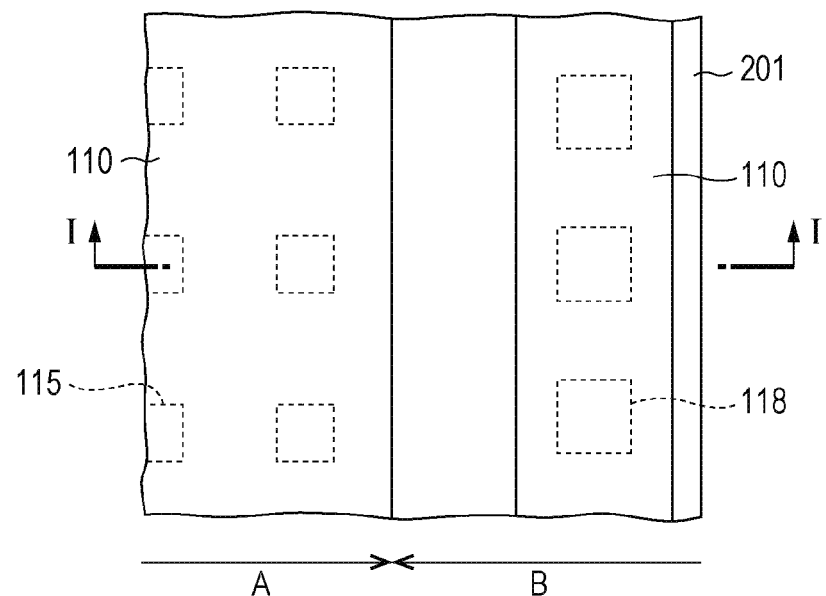
FIG. 3A is an enlarged view of a portion of the plan view of FIG. 2.
Figure 3B:
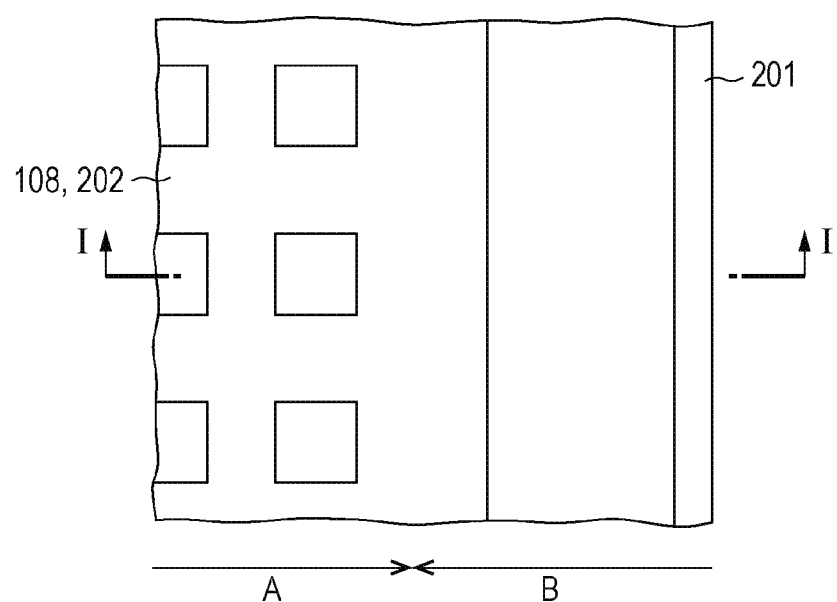
FIG. 3B is an enlarged view of a portion of the plan view of FIG. 2.

FIG. 3A is an enlarged view of portion III in FIG. 2 and is a plan view including the wiring 110. FIG. 3B is an enlarged view of portion III in FIG. 2 and is a plan view showing a state excluding the wiring 110 and the interlayer insulating layer 109. FIG. 1 corresponds to a cross sectional view taken along line I-I in FIG. 3A. As shown in FIG. 3A, the wiring 110 is formed in the cell region A including the upper portions of the contact holes 115, and the wiring 110 is formed in the wiring region B including the upper portions of the contact holes 118. As shown in FIG. 3B, the gate electrode 108 is formed in the cell region A, and the gate wire 202 is provided on the field insulating film 201 in the wiring region B, the gate wire 202 being electrically connected to the gate electrode 108.

A substrate composed of hexagonal silicon carbide can be used as the semiconductor substrate 101. The thickness of the semiconductor substrate 101 is, for example, 250 μm or more and 350 μm or less, and the n-type impurity concentration of the semiconductor substrate 101 is, for example, $8 \times 10^{18}$ cm$^{-3}$ (n$^+$). When the impurity concentration of the semiconductor substrate 101 is set to be low, a substrate composed of cubic silicon carbide can be used as the semiconductor substrate 101.

The semiconductor layer 120 may be a silicon carbide layer formed by epitaxial growth on the main surface 101a of the semiconductor substrate 101. The thickness of the semiconductor layer 120 is, for example, 4 μm or more and 15 μm or less, and the n-type impurity concentration of the semiconductor layer 120 is, for example, $5 \times 10^{15}$ cm$^{-3}$ (n$^-$). Another epitaxial layer (for example, a silicon carbide semiconductor layer having a n-type impurity concentration of $6 \times 10^{16}$ cm$^{-3}$) may be provided between the semiconductor substrate 101 and the semiconductor layer 120.

The thickness (depth from the upper surface 120a of the semiconductor layer 120) of the first region 104 is, for example, 0.5 μm or more and 1.0 μm or less. The p-type impurity concentration of the first region 104 is, for example, $1.5 \times 10^{18}$ cm$^{-3}$ (p$^-$). The thickness (depth from the upper surface 120a of the semiconductor layer 120) of the second region 103 is, for example, 0.25 μm, and the n-type impurity concentration of the second region 103 is, for example, $5 \times 10^{19}$ cm$^{-3}$ (n$^{++}$).

The field insulating film 201 can be made of silicon oxide (SiO$_2$) formed by oxidizing polysilicon (poly-Si) or amorphous silicon. The thickness is, for example, 350 nm.

The gate insulating film 107 can be made of, for example, silicon oxide (SiO$_2$). The thickness is, for example, 70 nm. The gate electrode 108 can be made of, for example, polysilicon, and the thickness thereof is, for example, 500 nm. The first ohmic electrode 122 can be made of, for example, nickel silicide which is an alloy of Ni (nickel) and Si (silicon), and the thickness thereof is, for example, 70 nm. Also, the second ohmic electrode 111 can be made of, for example, titanium silicide or nickel silicide, and the thickness thereof is, for example, 100 nm. In order to facilitate soldering for mounting the semiconductor device 10 on a plastic package, nickel (Ni) and silver (Ag) or nickel (Ni) and gold (Au) may be deposited on the second ohmic electrode 111.

In the configuration of the embodiment, as shown in FIG. 1, the end 201b of the field insulating film 201 has a convex shape in a cross section perpendicular to the main surface 101a of the semiconductor substrate 101. Therefore, pattern thinning of the gate wire 202 can be suppressed, and thus the semiconductor device 10 with high yield and high reliability can be realized.

Here, a virtual center line (1) of the upper surface 201a of the field insulating film 201 is determined. The center line CD is parallel with the upper surface of the semiconductor layer 120. In the end 201b of the field insulating film 201, a position where the upper surface 201a of the field insulating film 201 separates from the center line (1) is denoted by x, and a position where the upper surface 201a of the field insulating film 201 contacts with the upper surface of the semiconductor layer 120 is denoted by y. Then, a virtual line (2) passing through the positions x and y is determined. In the configuration shown in FIG. 1, the end 201b of the field insulating film 201 projects upward or curves outward from the line (2). This state represents that the end 201b of the field insulating film 201 has a convex shape.

Figure 4A:
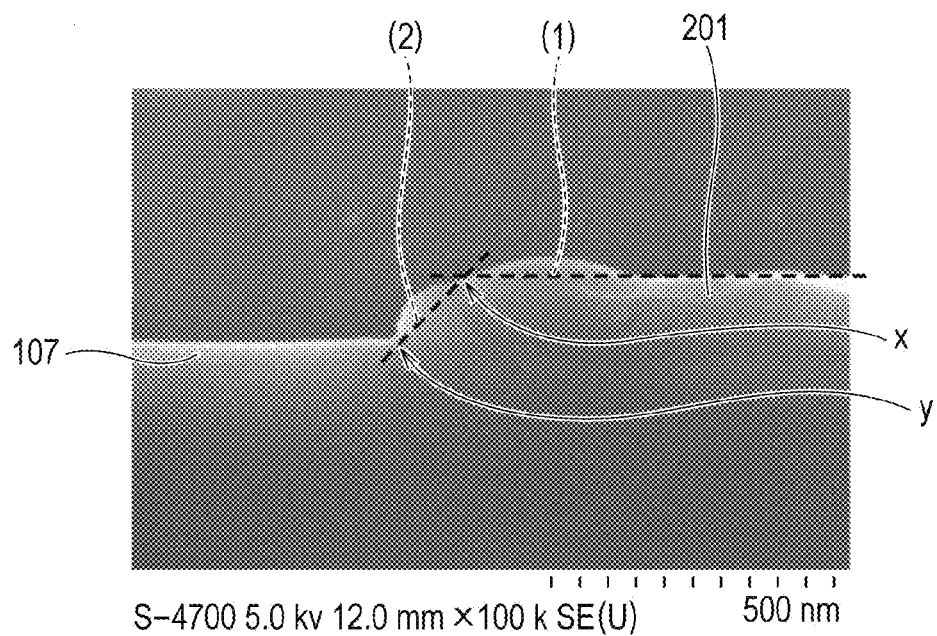
FIG. 4A is a SEM photograph of a cross section of a field insulating film of a semiconductor device according an embodiment.
Figure 4B:
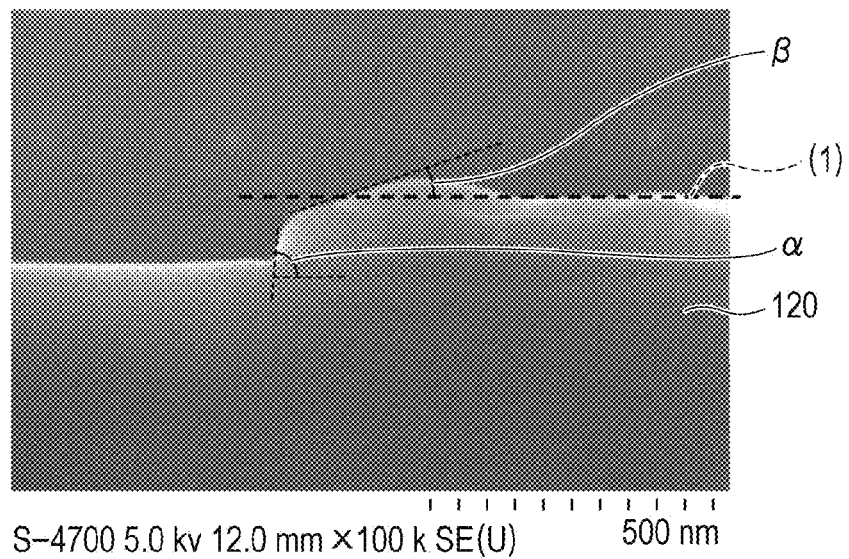
FIG. 4B is a SEM photograph of a cross section of a field insulating film of a semiconductor device according an embodiment.

FIGS. 4A and 4B are SEM (Scanning Electron Microscope) photographs of a cross section of the actual field insulating film 201. FIGS. 4A and 4B are the same photograph. FIGS. 4A and 4B show the field insulating film 201 formed by depositing polysilicon to 200 nm, patterning the polysilicon, and then oxidizing the polysilicon at 1200° C. in a dry oxygen atmosphere. A thermal oxide film in a Si plane of silicon carbide has a thickness of 50 nm.

FIG. 4A shows the virtual lines (1) and (2) described in FIG. 1. It is found that the end of the field insulating film 201 curves outward from the line (2) and has a convex shape. FIG. 4B shows an angle (taper angle) α formed by the upper surface of the semiconductor layer 120 and a tangent to a portion where the end of the field insulating film 201 is in contact with the semiconductor layer 120, and an angle (taper angle) β formed by the center line (1) and a tangent to a portion where the end of the field insulating film 201 crosses the center line (1). Since the end of the field insulating film 201 has a convex shape, the angle α is, for example, 80° or more and less than 90°, and the angle β is, for example, 5° or more and 30° or less.

Also, in the configuration of the embodiment, as shown in FIG. 1, the upper surface 201a of the field insulating film 201 becomes rough and has irregularities. FIGS. 4A and 4B also show that the upper surface of the field insulating film 201 has irregularities. Therefore, adhesion between the field insulating film 201 and the gate wire 202 can be improved.

The upper surface 201a of the field insulating film 201 is rougher, for example, than the upper surface of a portion of the gate wire 202 below which the field insulating film 201 is not formed. In addition, the centerline average roughness (Ra) of the upper surface 201a of the field insulating film 201 is, for example, within a range of 0.025 µm to 0.1 µm. The centerline average roughness (Ra) can be determined by measurement with a surface roughness meter or determined from the center line (1) and a roughness curve determined from a sectional shape.

Further, in the configuration of the embodiment, the depth D1 of the first region 104 in a portion below the field insulating film 201 is larger than the depth of the first region 104 in a portion where the field insulating film 201 is not provided. For example, the gate insulating film 107 is formed between the first region 104 and the portion of the gate wire 202 below which the field insulating film 201 is not formed, and the first region 104 disposed below the gate insulating film 107 has depth D2. In this case, the relation D1>D2 is present. Therefore, the first region 104 disposed below the field insulating film 201 is decreased in sheet resistance, and thus potential drop due to a current at turning-off can be decreased, and a breakdown of the gate insulating film can be suppressed.

According to the embodiment, as described above, the end 201b of the field insulating film 201 has a convex shape, and thus pattern thinning of the gate wire 202 can be suppressed. Also, the upper surface 201a of the field insulating film 201 has irregularities, and thus adhesion to the gate wire 202 can be improved. Further, the depth D1 of the first region 104 in a portion below the field insulating film 201 is larger than that in other portions, and thus potential drop due to a current at turning off can be decreased by a decrease in sheet resistance. Further, in the gate pad region C, the upper surface 201a of the field insulating film 201 has irregularities, and thus stress due to probing and bonding can be dispersed. Therefore, the semiconductor device 10 with high yield and high reliability can be realized.

Figure 5:
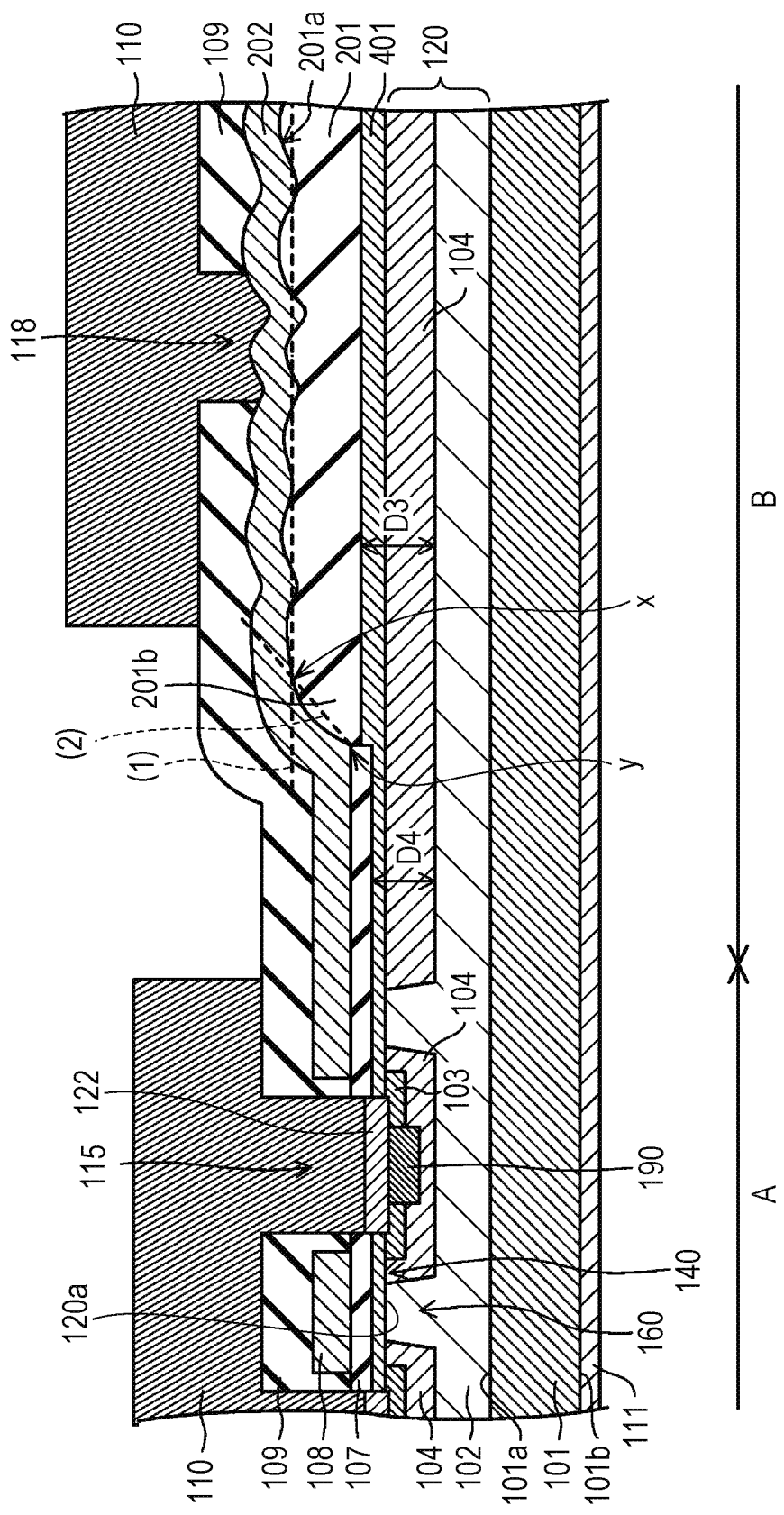
FIG. 5 is a cross sectional view illustrating another configuration of a semiconductor device according an embodiment.

The same effect as in the embodiment can be achieved as long as a semiconductor device has a configuration including the gate electrode 108 and the gate wire 202. Although FIG. 1 shows the semiconductor device with an inversion type channel structure as an example, for example, as shown in FIG. 5, a semiconductor device 10A may include a channel layer 401 functioning as an accumulation type channel and provided between a first region 104 and a gate insulating film 107. In a configuration shown in FIG. 5, the n-type channel layer 401 is provided between the first region 104 and the gate insulating film 107. The other portions in the configuration are the same as in the configuration shown in FIG. 1. When the channel layer 401 is added, the depth of the p-type first region 104 in a region below the field insulating film 201 is the same as the depth of the p-type first region 104 in a region where the field insulating film 201 is not provided. However, the total depth D3 of the channel layer 401 and the first region 104 in a region below the field insulating film 201 is larger than the total depth D4 in a region where the field insulating film 201 is not provided. Since a current flows through both the channel layer 401 and the first region 104 at turning-off, like in the configuration shown in FIG. 1, in the configuration shown in FIG. 5, a potential drop due to the current at turning-off can be decreased, and a breakdown of the gate insulating film can be suppressed.

FIG. 1 shows a planar-type MOS structure, but the same effect can be obtained by, for example, a trench-type MOS structure, an insulated gate bipolar transistor (IGBT), a lateral type device, and the like.

MODIFIED EXAMPLE

Figure 6:
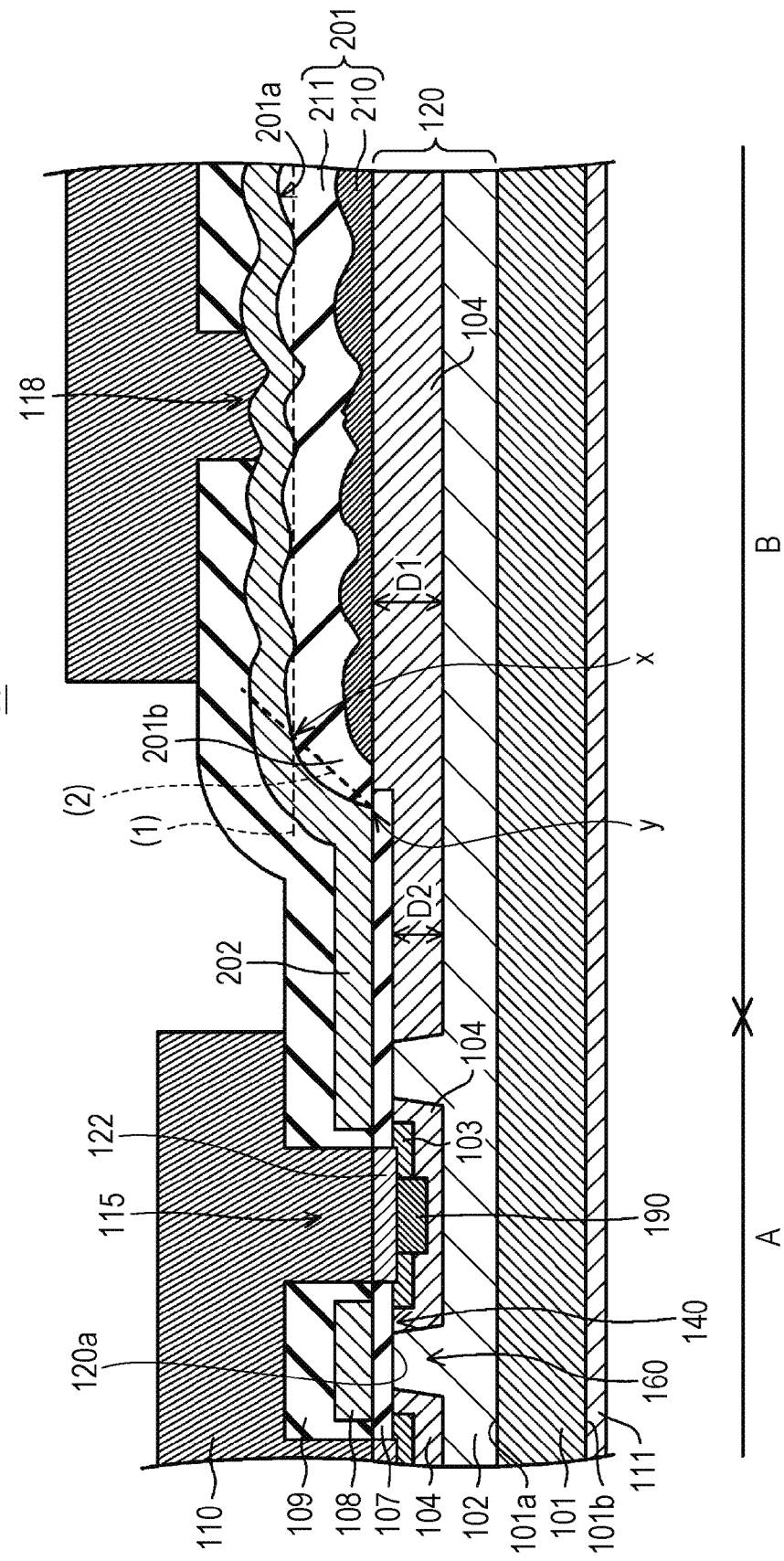
FIG. 6 is a cross sectional view illustrating a configuration of a semiconductor device according a modified example.

FIG. 6 shows a semiconductor device 11 according to a modified example of the embodiment shown in FIG. 1. In FIG. 6, substantially the same components as in FIG. 1 are denoted by the same reference numerals, and detailed description thereof may be omitted. The cell region A is the same as in FIG. 1, and thus description thereof is omitted.

A configuration shown in FIG. 6 includes the field insulating film 201 formed in the wiring region B, and the field insulating film 201 includes a first insulating film 210 and a second insulating film 211. The lower surface of the first insulating film 210 is in contact with the upper surface of the semiconductor layer 120. The second insulating film 211 is provided between the first insulating film 210 and the gate wire 202.

The first insulating film 210 is composed of, for example, polysilicon having a low impurity concentration, and the second insulating film 211 is composed of for example, silicon oxide ($SiO_2$). The second insulating film 211 may be formed by thermal oxidization of the first insulating film 210. For example, the thicknesses of the first insulating film 210 and the second insulating film 211 are 100 nm and 350 nm, respectively, and the total thickness is 450 nm.

In a configuration of the modified example, the field insulating film 201 includes the first insulating film 210 having lower hardness than the second insulating film 211. Therefore, in the gate-pad region C shown in FIG. 2, stress due to probing and bonding can be further dispersed, and thus a breakdown of the field insulating film 201 can be suppressed.

With the configuration of the modified example, the same effect as in the configuration according to the above-described embodiment can be achieved. That is, the end 201b of the field insulating film 201 has a convex shape, and thus pattern thinning of the gate wire 202 can be suppressed. Also, the upper surface 201a of the field insulating film 201 has irregularities, and thus adhesion to the gate wire 202 can be improved. Further, the depth D1 of the first region 104 in a portion below the field insulating film 201 is larger than the depth of the first region 104 in other portions, and thus potential drop due to a current at turning-off can be decreased by a decrease in sheet resistance. Therefore, the semiconductor device 11 having high yield and high reliability can be realized.

Method for Manufacturing Semiconductor Device According to Embodiment

Next, a method for manufacturing the semiconductor device 10 of the embodiment is described with reference to FIG. 7A to FIG. 11B. FIG. 7A to FIG. 11B show the respective steps of the method for manufacturing the semiconductor device of the embodiment.

First, in order to produce a structure shown in FIG. 7A, the step below is performed. An n-type 4H-SiC (0001) substrate is prepared as the semiconductor substrate 101. A substrate 8° or 4° off-cut in a <11-20> direction can be used as the substrate. The n-type impurity concentration of the substrate can be set to $1\times10^{18}$ cm$^{-3}$ or more and $5\times10^{19}$ cm$^{-3}$ or less.

Next, the semiconductor layer 120 is formed on the main surface 101a of the semiconductor substrate 101 by epitaxial growth or the like. The semiconductor layer 120 can be formed by, for example, a thermal chemical vapor deposition (CVD) method using silane ($SiH_4$) and propane ($C_3H_8$) as raw material gases, hydrogen ($H_2$) as carrier gas, and nitrogen ($N_2$) as dopant gas. The thickness of the semiconductor layer 120 can be set to 10 µm or more. The n-type impurity concentration of the semiconductor layer 120 can be set to $1\times10^{15}$ cm$^{-3}$ or more and $1\times10^{16}$ cm$^{-3}$ or less.

Next, an implantation mask material is deposited (not shown) on the upper surface 120a of the semiconductor layer 120, and photoresist (not shown) is formed on the deposited implantation mask material. The implantation mask material can be, for example, silicon oxide. Silicon oxide as the implantation mask material an be deposited by, for example, a plasma CVD method using silane ($SiH_4$) and nitrogen monoxide ($N_2O$) gas with a power of 200 W. The thickness of the implantation mask material can be set to 0.5 µm or more and 1.0 µm or less. The photoresist has a position and dimensions which define the first region 104 and the JFET region 160. For example, a photosensitive organic film can be used as the photoresist, and a typical photolithography can be used. The thickness of the photoresist can be set to 1.5 µm or more and 2.0 µm or less. An implantation mask pattern 172 is formed by anisotropic etching of the implantation mask material using the photoresist as a mask, and then the photoresist is removed. The implantation mask material can be etched by, for example, anisotropic dry etching using $CF_4$ gas and $CHF_3$ gas. The photoresist can be removed by, for example, ashing with oxygen plasma. Hereinafter an implantation mask for ion implantation can be formed by the same method as the above unless otherwise specified.

Figure 7A:
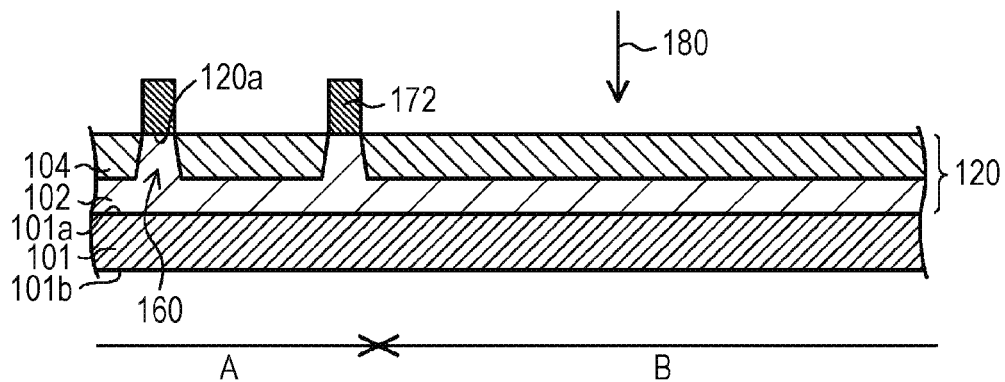
FIG. 7A is a cross sectional view illustrating a step for manufacturing of a semiconductor device according an embodiment.

Next, as shown in FIG. 7A, aluminum ions ($A^-$) 180 are implanted (shown by an arrow) as p-type impurity into the semiconductor layer 120 using the implantation mask pattern 172 as a mask, forming the first region 104 having a predetermined depth in the vicinity of the upper surface 120a of the semiconductor layer 120. Ion implantation can be performed plural times with different energies within a range of 30 keV to 350 keV while the temperature of the semiconductor substrate 101 on which the semiconductor layer 120 has been formed is kept at 500° C. The depth of the first region 104 can be set to, for example, 0.5 µm or more and 1.0 µm or less. A vicinity region of the upper surface 120a of the semiconductor layer 120, which is defined by being disposed between first regions 104, serves as the JFET region 160. In the embodiment, the width of the JFET region 160 can be set to, for example, 3 µm. In the semiconductor layer 120, a residual region where the first region 104 has not been formed serves as a drift region 102.

Figure 7B:
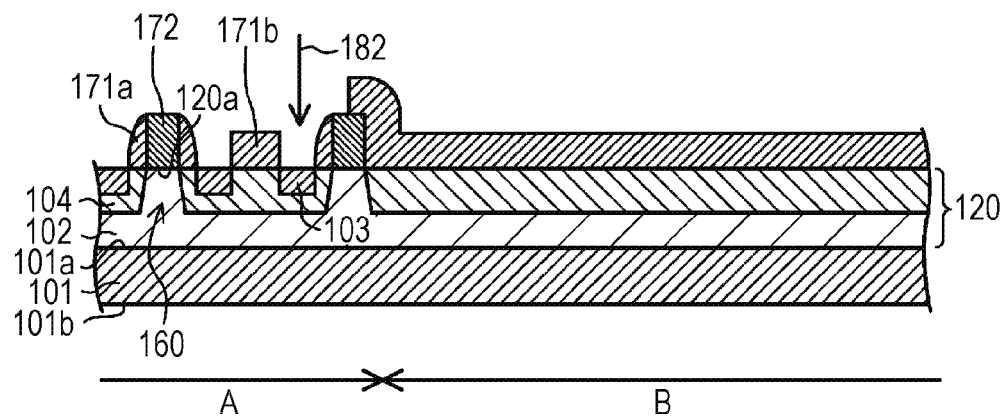
FIG. 7B is a cross sectional view illustrating a step for manufacturing of a semiconductor device according an embodiment.

Next, as shown in FIG. 7B, an implantation mask material is deposited on the upper surface 120a of the semiconductor layer 120 so as to cover the implantation mask pattern 172. The implantation mask material is for example, polysilicon (poly-Si) and can be deposited by thermal CVD method using $SiH_4$ as raw material gas. Then, photoresist (not shown) having a predetermined pattern is formed on the implantation mask material, and then implantation mask patterns 171a and 171b are formed by anisotropic etching of the implantation mask material. The implantation mask pattern 171b shown in the drawing is a pattern disposed below the photoresist and is provided for preventing impurity implantation into a region where the contact region 190 to be formed. The implantation mask pattern 171a forms sidewalls of the implantation mask pattern 172 and defines a channel width (length). Anisotropic etching can be performed by using, for example, mixed gas of chlorine ($Cl_2$), oxygen ($O_2$), and hydrogen bromide (HBr).

Then, nitrogen ions (Ni) or phosphorus ions ($P^+$) 182 are implanted (shown by an arrow) into the upper surface 120a of the semiconductor layer 120 by using the implantation mask patterns 172, 171a, and 171b as a mask, forming the second region 103. Ion implantation can be performed plural times with different energies within a range of 30 keV to 90 keV while the temperature of the semiconductor substrate 101 is kept at 500° C. The depth of the second region 103 can be set to, for example, 0.25 µm.

Figure 7C:
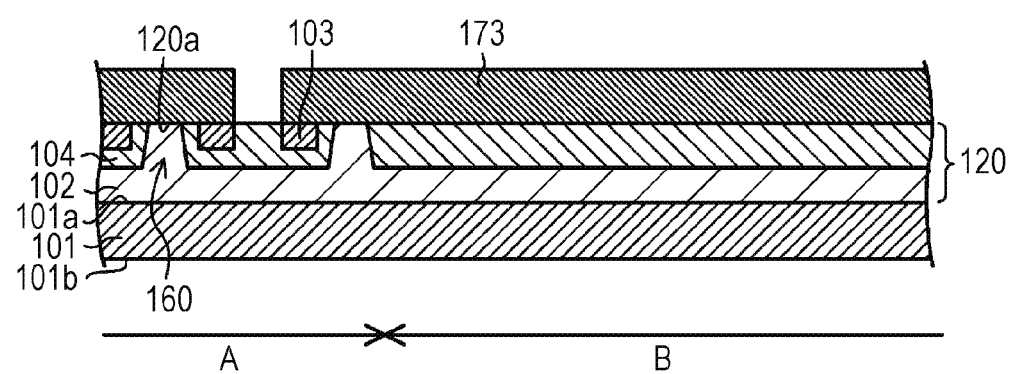
FIG. 7C is a cross sectional view illustrating a step for manufacturing of a semiconductor device according an embodiment.

Next, as shown in FIG. 7C, after the implantation mask patterns 171a, 171b, and 172 are removed, an implantation mask pattern 173 is formed. When the implantation mask patterns 171a and 171b are composed of an oxide film, the mask patterns can be removed with an aqueous solution of hydrofluoric acid (HF). When the implantation mask pattern 172 is composed of polysilicon, the mask pattern can be removed with a liquid mixture of hydrofluoric acid (HF), nitric acid (HNO$_3$), and hydrogen peroxide (H$_2$O$_2$).

Figure 8A:
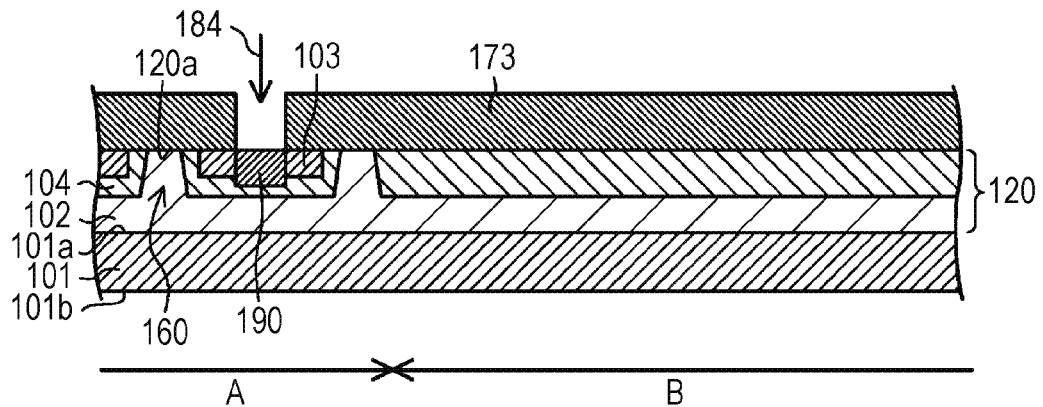
FIG. 8A is a cross sectional view illustrating a step for manufacturing of a semiconductor device according an embodiment.

Next, as shown in FIG. 8A, aluminum ions (Al$^+$) 184 are implanted (shown by an arrow) to the first region 104 using the implantation mask pattern 173 as a mask, forming the contact region 190. The contact region 190 can be formed by preforming the ion implantation plural times with different energies within a range of 90 keV to 150 keV while the temperature of the semiconductor substrate 101 is kept at 500° C. The depth of the contact region 190 can be set to, for example, 0.3 μm.

Next, after the implantation mask pattern 173 is removed, the semiconductor substrate 101 having the semiconductor layer 120 in which a plurality of impurity diffusion regions have been formed is annealed for activation at a temperature of 1000° C. or more. In the embodiment, the temperature of the annealing is, for example, 1800° C.

Figure 8B:
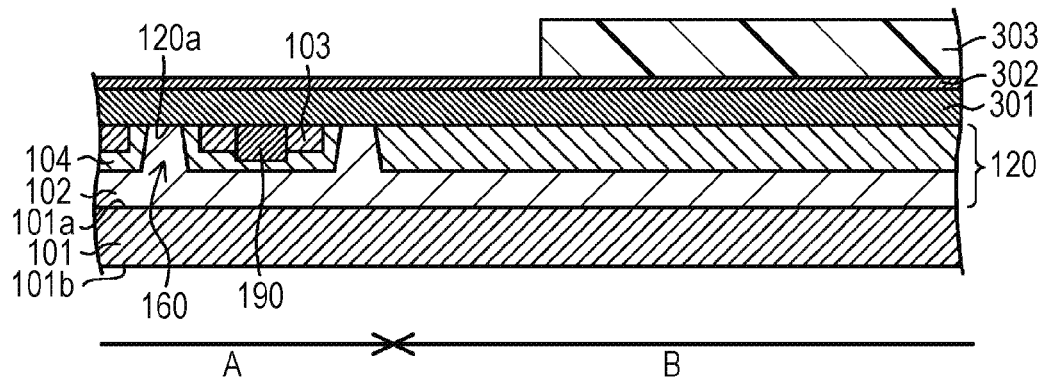
FIG. 8B is a cross sectional view illustrating a step for manufacturing of a semiconductor device according an embodiment.

Next, as shown in FIG. 8B, a silicon material 301 is deposited on the semiconductor layer 120, and a mask material 302 is formed on the silicon material 301. Then, a photoresist 303 in which a field insulating film pattern has been formed is formed. The silicon material 301 is deposited by, for example, a low-pressure CVD method using polysilicon or amorphous silicon, and the thickness is 175 nm. The mask material 302 is made of an oxide film formed by, for example, a plasma CVD method. The reason for forming the mask material 302 is that during wet etching of the silicon material 301 performed in a next step, the photoresist lacks etching resistance. When etching resistance is satisfactory, the mask material 302 need not be formed.

Figure 8C:
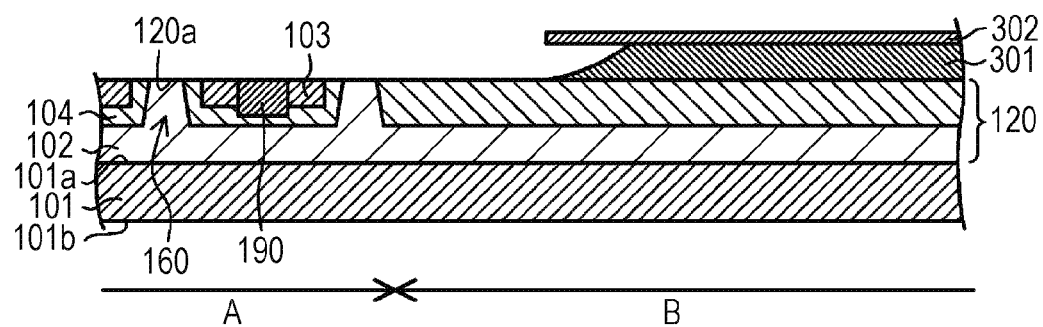
FIG. 8C is a cross sectional view illustrating a step for manufacturing of a semiconductor device according an embodiment.

Next, as shown in FIG. 8C, the mask material 302 is etched by using the photoresist 303 as a mask to transfer the field insulating film pattern. The mask material 302 is etched by, for example, dry etching with CHF$_3$ and O$_2$ gas, but wet etching with hydrofluoric acid may be performed.

Next, after the photoresist 303 is removed, the silicon material 301 is etched by wet etching as isotropic etching with a liquid mixture of hydrofluoric acid (HF), nitric acid (HNO$_3$), and hydrogen peroxide (H$_2$O$_2$) to transfer the field insulating film pattern. The isotropic etching can realize a tapered shape at the end of the field insulating film pattern of the silicon material 301. Using wet etching can minimize etching of the semiconductor layer 120 during etching of the silicon material 301.

In the embodiment, the field insulating film pattern formed by the photoresist 303 is transferred to the mask material 302 and the silicon material 301 in that order. As described above, this is because when a liquid mixture of hydrofluoric acid and fluonitric acid is used, the photoresist peels due to insufficient etching resistance of the photoresist 303. However, the pattern can be transferred directly to the silicon material by changing a wet etching solution or a photoresist material. In this case, formation and etching of the mask material 302 can be omitted. In addition, isotropic etching can be performed by plasma etching with NF$_3$ gas or the like.

Figure 9A:
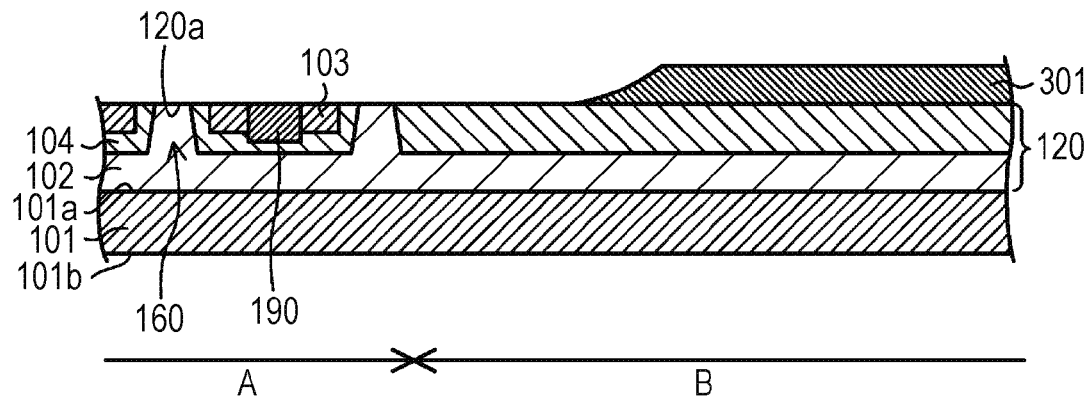
FIG. 9A is a cross sectional view illustrating a step for manufacturing of a semiconductor device according an embodiment.

Next, as shown in FIG. 9A, the mask material 302 is removed by, for example, using hydrofluoric acid.

Figure 9B:
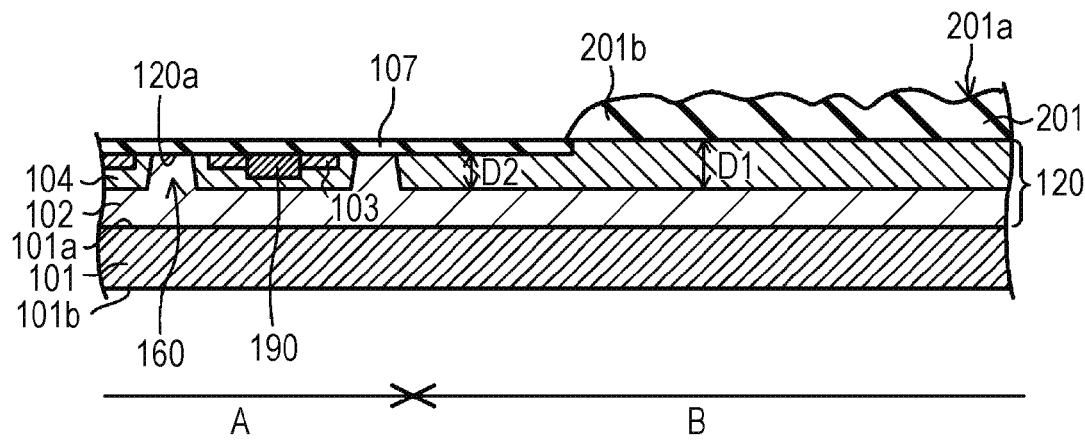
FIG. 9B is a cross sectional view illustrating a step for manufacturing of a semiconductor device according an embodiment.

Next, as shown in FIG. 9B, the gate insulating film 107 composed of silicon oxide (SiO$_2$) is formed on the semiconductor layer 120 by thermal oxidation. Thermal oxidation of a silicon semiconductor is generally performed at about 900° C., but thermal oxidation of silicon carbide is performed, for example, at a temperature of about 1200° C. in a dry oxygen atmosphere because the rate of thermal oxidation of silicon carbide is lower than that of silicon. At the same time, the silicon material 301 is also oxidized. In this case, the temperature of thermal oxidation is preferably 1100° C. or more.

In the embodiment, the silicon material 301 has a thickness of 175 nm, and thus the silicon material 301 is completely oxidized to form the field insulating film 201 having a thickness of about 350 nm. Even when the silicon material 301 is amorphous silicon, the amorphous silicon is converted to polysilicon due to recrystallization at a temperature during oxidation before being completely oxidized.

During thermal oxidation of polysilicon, irregularities corresponding to grains of the polysilicon are formed in the upper surface of the oxide film. As a result, the upper surface 201a of the field insulating film 201 becomes rough, and irregularities with Ra of 0.025 μm to 0.1 μm are formed. In addition, a convex shape is formed at the end 201b of the field insulating film 201. When a silicon material having a corner portion is oxidized, the corner portion becomes acute due to the occurrence of a horn phenomenon during thermal oxidation at about 900° C. However, in thermal oxidation at a high temperature of 1100° C. or more, the viscosity of the oxide film is decreased, and thus the corner portion of the silicon material is deformed to a round shape by the action of surface tension. Therefore, the end 201b of the field insulating film 201 has an outward curve and a convex shape due to thermal oxidation in the example. For example, as described above, a tangent to a portion where the end of the field insulating film 201 is in contact with the semiconductor layer 120 has an angle α of, for example, 80° or more and less than 90° with the upper surface of the semiconductor layer 120. A tangent to a portion where the end of the field insulating film 201 crosses the canner line (1) of the upper surface 201a of the field insulating film 210 has an angle β of, for example, 5° or more and 30° or less with the center line (1).

Also, in an initial stage of oxidation, the ratio of oxidation rate of the semiconductor layer 120 to the silicon material 301 is ⅙ to ½₅. However, in a long-term oxidation process, oxygen passes through a distance in the silicon material 301 until it reaches the unoxidized silicon material 301, thereby decreasing the rate of oxidation. In the embodiment, when the gate insulating film 107 is formed to a thickness of 70 nm, the thickness of an oxide film of polysilicon which constitutes the silicon material 301 is about 5 times, that is, 350 nm. During oxidation of the silicon material 301, the silicon material 301 with a thickness of about half of the oxide film thickness is consumed. Therefore, when the thickness of the silicon material 301 is 175 nm, the silicon material 301 is entirely oxidized. That is, the field insulating film 201 having a thickness of about 2 times the thickness of the deposited silicon material 301 can be formed. In order to decrease a finally formed step and improve flatness of a product by decreasing the thickness of the field insulating film 201 as compared with the example, the thickness of the silicon material 301 may be set to be small.

In addition, oxygen required for oxidation is consumed by oxidation of the silicon material 301, and thus oxidation of the first region 104 disposed be the silicon material 301 can be minimized. Therefore, comparing the depth D1 of the first region 104 in a region below the field insulating film 201 with the depth D2 in a region where the field insulating film 201 is not present in the cell region A and the wiring region B, the relation of D1>D2 can be realized. Even when the thickness of the silicon material 301 is smaller than that to be oxidized in the gate oxidation step, the relation is maintained. Since the silicon material 301 and silicon carbide which constitutes the first region below the field insulating film 201 have greatly different rates of oxidation, an amount of oxidation of the first region 104 below the field insulating film 201 can be suppressed.

Figure 9C:
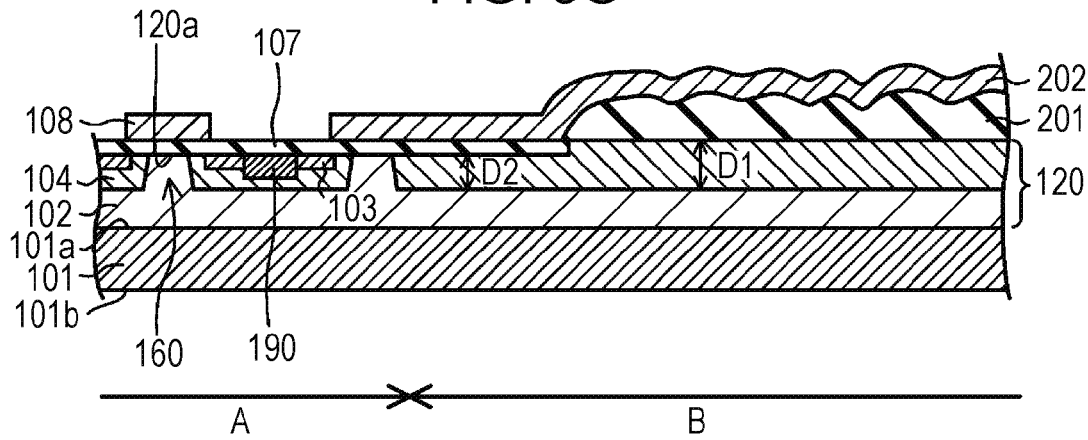
FIG. 9C is a cross sectional view illustrating a step for manufacturing of a semiconductor device according an embodiment.

Next, as shown in FIG. 9C, a gate electrode material composed of polysilicon (Poly-Si) is deposited on the gate insulating film 107 and the filed insulating film 201. Then, a photoresist (not shown) is formed on the gate electrode material, the gate electrode material is etched, and then the photoresist is removed to form the gate electrode 108 and the gate wire 202. The material and thickness of the gate electrode 108 may be appropriately selected.

Figure 10A:
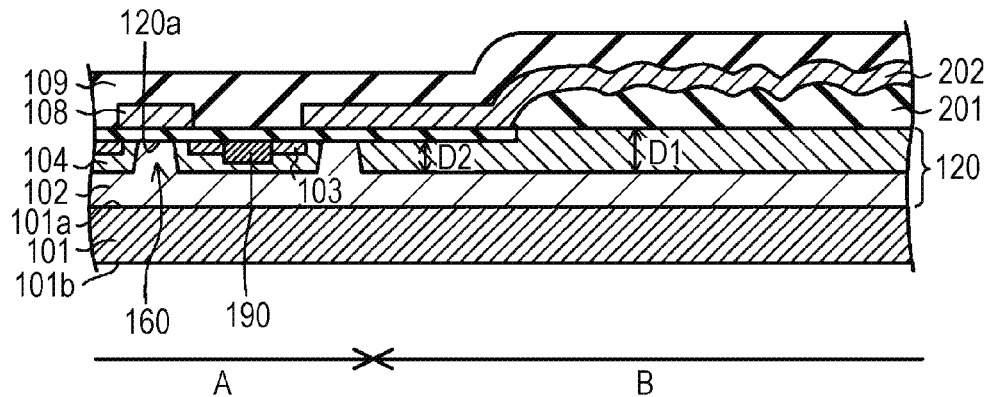
FIG. 10A is a cross sectional view illustrating a step for manufacturing of a semiconductor device according an embodiment.

Next, as shown in FIG. 10A, the interlayer insulating layer 109 is formed on the semiconductor layer 120 so as to cover the gate electrode 108 and the gate wire 202. The interlayer insulating layer 109 can be composed of, for example, silicon oxide ($SiO_2$), and the thickness thereof is, for example, 1000 nm.

Figure 10B:
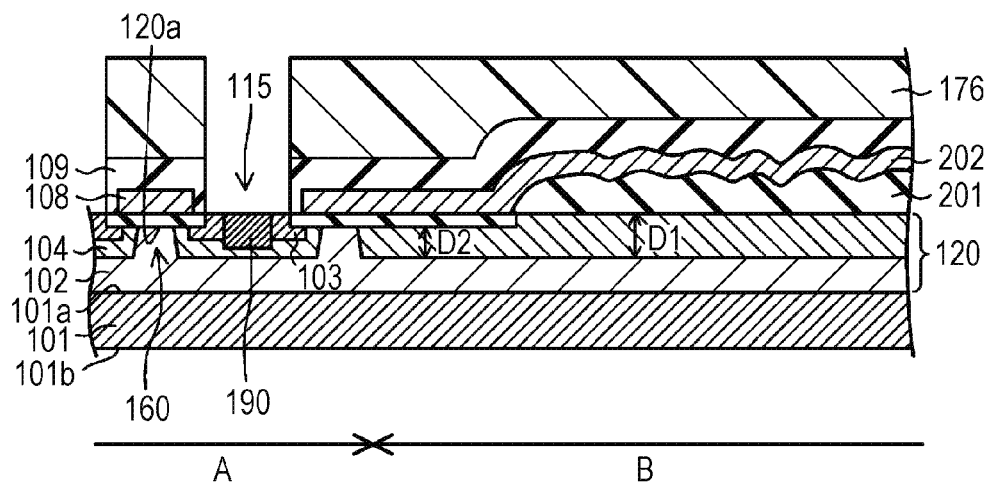
FIG. 10B is a cross sectional view illustrating a step for manufacturing of a semiconductor device according an embodiment.

Next, as shown in FIG. 10B, the interlayer insulating layer 109 is etched using photoresist 176 as a mask to form the contact hole 115. The interlayer insulating layer 109 can be etched by, for example, dry etching with a mixed gas of $CHF_3$ and $O_2$.

Figure 10C:
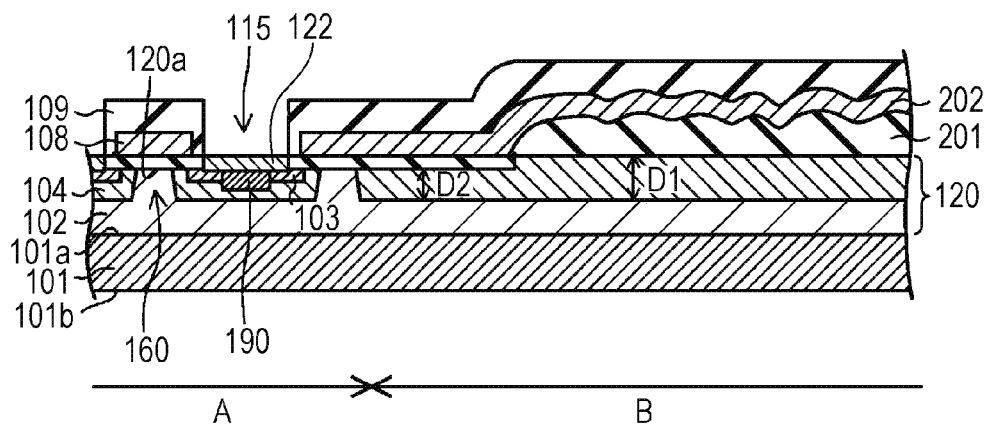
FIG. 10C is a cross sectional view illustrating a step for manufacturing of a semiconductor device according an embodiment.

Next, as shown in FIG. 10C, after the photoresist 176 is removed, nickel (Ni) is deposited (not shown) as a contact metal at least in the contact hole 115. Next, silicidation between the contact metal in the contact hole 115 and the contact region 190 is carried out by heat treatment of the contact metal. Then, the unreacted contact metal is removed to form the first ohmic electrode 122 in the contact hole 115.

Figure 11A:
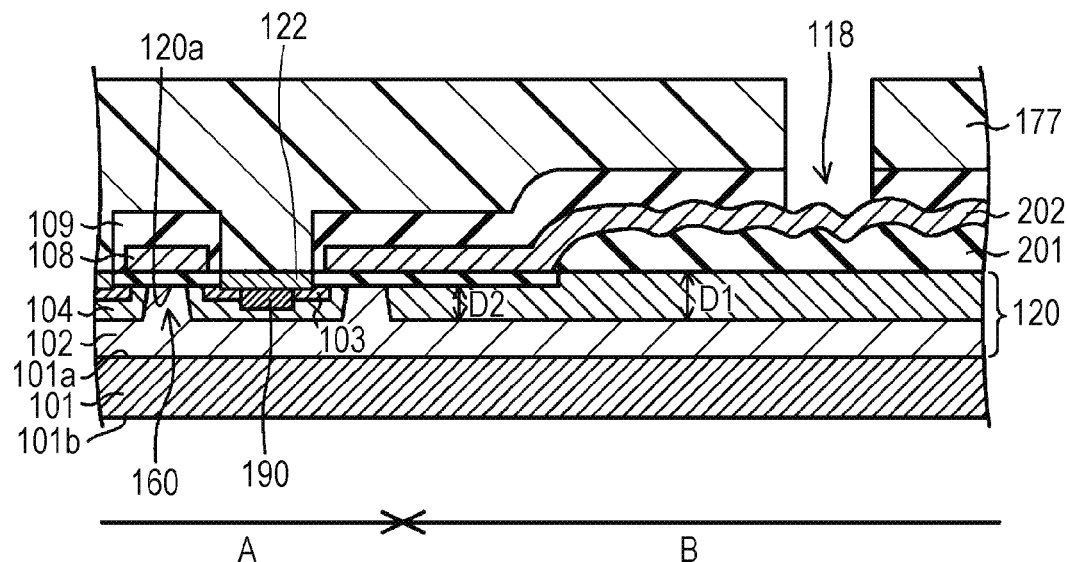
FIG. 11A is a cross sectional view illustrating a step for manufacturing of a semiconductor device according an embodiment.

Next, as shown in FIG. 11A, the interlayer insulating layer 109 is etched using photoresist 177 as a mask to form the contact hole 118 to the gate wire. The interlayer insulating layer 109 can be etched by, for example, dry etching with a mixed gas of $CHF_3$ and $O_2$.

Figure 11B:
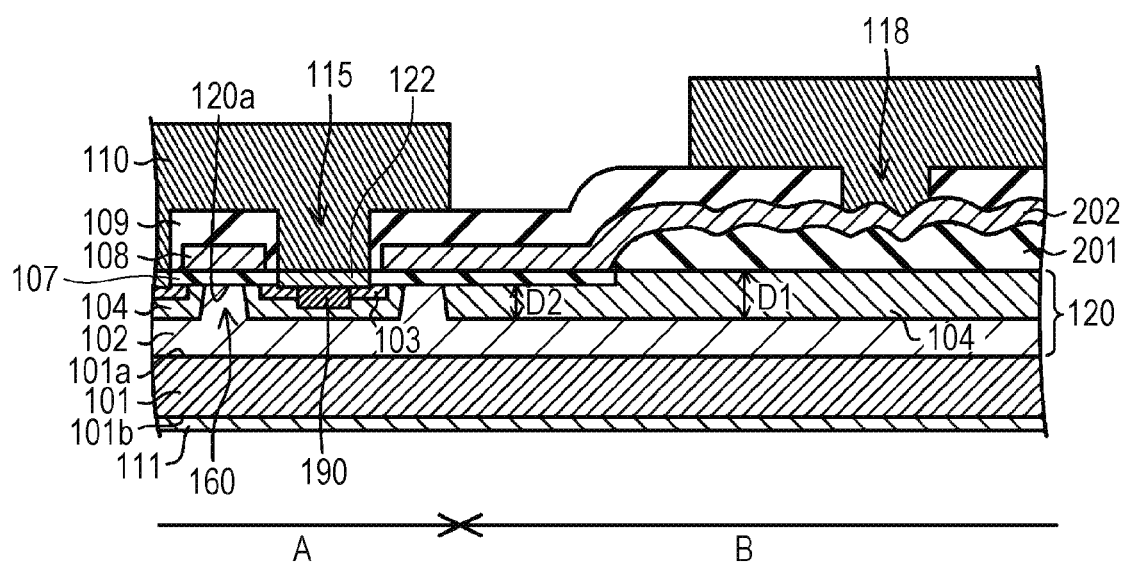
FIG. 11B is a cross sectional view illustrating a step for manufacturing of a semiconductor device according an embodiment.

Next, as shown in FIG. 11B, after the photoresist 177 is removed, a metal is deposited on the back surface 101b of the semiconductor substrate 101 and heat-treated to for the second ohmic electrode 111. The second ohmic electrode 111 can be formed by, for example, depositing Ti and then performing heat treatment at 950° C. Then, the wiring 110 is formed in the contact hole 115 and the contact hole 118 so as to make contact with the first ohmic electrode 122 and the gate wire 202, thereby completing the semiconductor device 10.

Method for Manufacturing Semiconductor Device According to Modified Example

Next, a method for manufacturing the semiconductor device 11 according to the modified example is described with reference to FIG. 12A to FIG. 13B. FIG. 12A to FIG. 13B show the respective steps of the method for manufacturing the semiconductor device 11 according to the modified example.

Figure 12A:
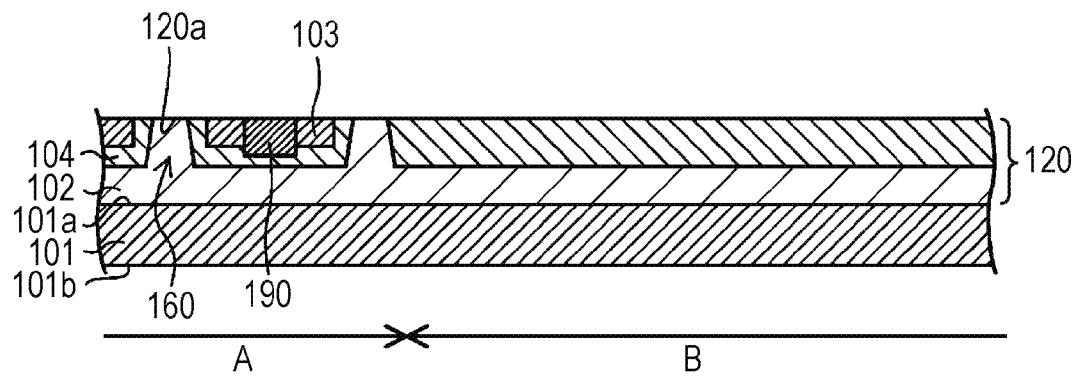
FIG. 12A is a cross sectional view illustrating a step for manufacturing of a semiconductor device according a modified example.

First, a structure shown in FIG. 12A is formed by the same method as described up to FIG. 8A in the method for manufacturing the semiconductor device 10.

Figure 12B:
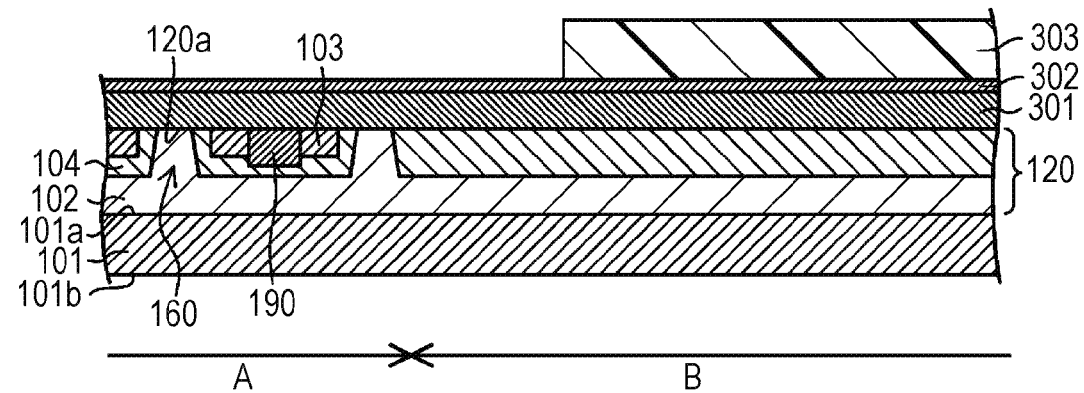
FIG. 12B is a cross sectional view illustrating a step for manufacturing of a semiconductor device according a modified example.

Next, as shown in FIG. 12B, a silicon material 301 is deposited on the semiconductor layer 120, and a mask material 302 is formed on the silicon material 301. Then, a photoresist 303 having a field insulating film pattern formed therein is formed. The silicon material 301 is formed by, for example, a low-pressure CVD method using polysilicon or amorphous silicon, and the thickness thereof is 500 nm. The thickness of the silicon material 301 is selected so that the thickness is not completely oxidized by next gate oxidization. When gate oxidation is performed at, for example, about 1220° C., the ratio of rate of oxidation of silicon carbide to the silicon material is about 1:5. Therefore, when gate oxidation is performed to a thickness of 70 nm, the silicon material is oxidized to a thickness of about 350 nm. Therefore, when the thickness of the silicon material is 500 nm, the silicon material of about 150 nm remains unoxidized. These thicknesses can be appropriately changed. The mask material 302 is made of an oxide film formed by, for example, a plasma CVD method. The reason for forming the mask material 302 is that during wet etching of the silicon material 301 performed in a next step, the photoresist lacks etching resistance. When etching resistance is satisfactory, the mask material 302 need not be formed.

Figure 12C:
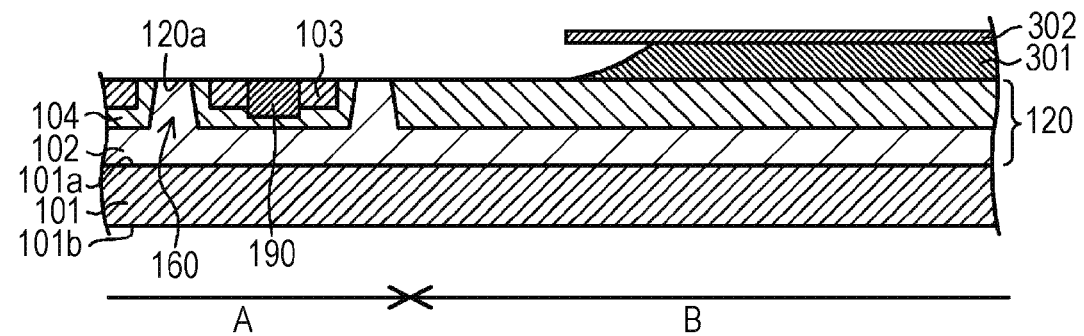
FIG. 12C is a cross sectional view illustrating a step for manufacturing of a semiconductor device according a modified example.

Next, as shown in FIG. 12C, the mask material 302 is etched by using the photoresist 303 as a mask to transfer the field insulating film pattern. The mask material 302 is etched by, for example, dry etching with $CHF_3$ and $O_2$ gas, but wet etching with hydrofluoric acid may be performed.

Next, after the photoresist 303 is removed, the silicon material 301 is etched by, for example, wet etching with a liquid mixture of hydrofluoric acid and fluonitric acid to transfer the field insulating film pattern. Isotropic etching can realize a tapered shape in the end of the field insulating film pattern of the silicon material 301. In the modified example, the field insulating film pattern formed by the photoresist 303 is transferred to the mask material 302 and the silicon material 301 in that order. As described above, this is because when a liquid mixture of hydrofluoric acid and fluonitric acid is used, the photoresist peels due to insufficient etching resistance of the photoresist 303. However, the pattern can be transferred directly to the silicon material by changing a wet etching solution or a photoresist material. In this case, formation and etching of the mask material 302 can be omitted.

Figure 13A:
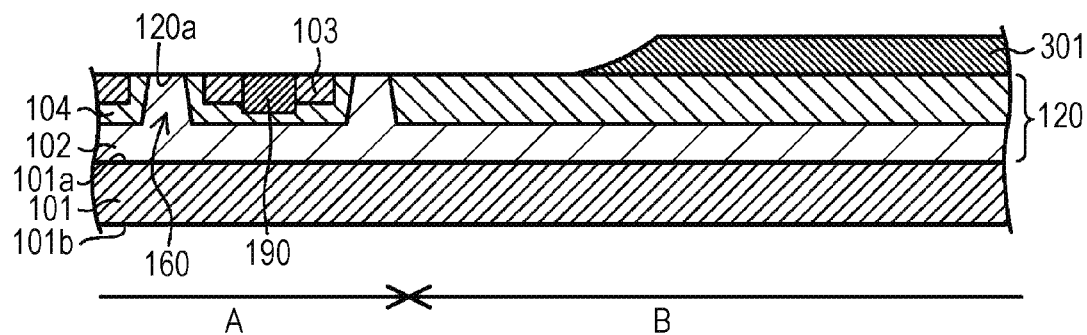
FIG. 13A is a cross sectional view illustrating a step for manufacturing of a semiconductor device according a modified example.

Next, as shown in FIG. 13A, the mask material 302 is removed by, for example, using hydrofluoric acid.

Figure 13B:
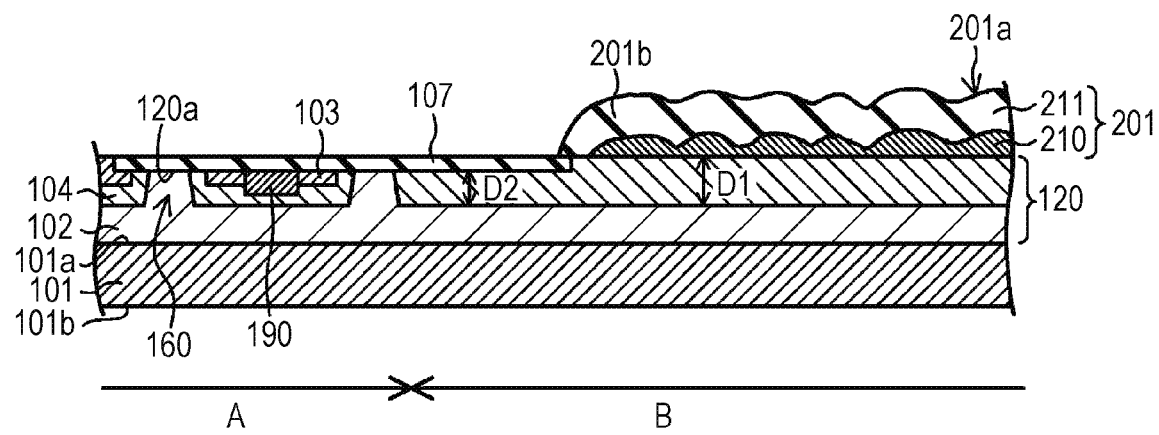
FIG. 13B is a cross sectional view illustrating a step for manufacturing of a semiconductor device according a modified example.

Next, as shown in FIG. 13B, the gate insulating film 107 composed of silicon oxide ($SiO_2$) is formed on the semiconductor layer 120 by, for example, thermal oxidation at 1200° C. in a dry oxygen atmosphere. At the same time, the silicon material 301 is also oxidized. In this case, the temperature of thermal oxidation is preferably 1100° C. or more. In the modified example, the silicon material 301 has a thickness of 500 nm, and thus the silicon material 301 is oxidized in its surface including the end of the field insulating film pattern, and the silicon material 301 remains inside, thereby forming the field insulating film 201 including a first insulating film 210 composed of polysilicon and a second insulating film 211 composed of silicon oxide. Even when the silicon material 301 is amorphous silicon, the amorphous silicon is converted to polysilicon due to recrystallization at a temperature during oxidation before being completely oxidized.

In an initial stage of oxidation, the ratio of oxidation rate of the semiconductor layer 120 to the silicon material 301 is ⅙ to ¹/₂₅. However, in a longterm oxidation process, oxygen passes through a distance in the silicon material 301 until it reaches the unoxidized silicon material 301, thereby decreasing the rate of oxidation. In the modified example, when the gate insulating film 107 is formed to a thickness of 70 nm, the thickness of an oxide film of polysilicon which constitutes the silicon material 301 is about 5 times, that is, 350 nm. Therefore, the thickness of the second insulating film 211 is within a range of 4 to 6 times the thickness of the gate insulating film 107. In this case, the silicon material 301 with a thickness of about half the second insulating film 211 is consumed. Therefore, the thickness of the first insulating film 210 is a value obtained by subtracting about a half of the thickness of the second insulating film 211 from the initial thickness of the silicon material 301 deposited. The thickness of the first insulating film 210 can be arbitrarily set to a desired value necessary for decreasing the parasitic capacity of the field insulating film 201 and deceasing bonding damage. For example, when the thickness of the first insulating film 210 is set to be large, the capacity between the gate wire 202 and the first region 104 with the field insulating film 201 therebetween can be made ⅕ or less the capacity between the gate electrode 108 and the first region 104. In order to suppress bonding damage to the semiconductor substrate 101, the field insulating film 201 is preferably as thick as possible, and in this case, the thickness of the first insulating film 210 may be set to be large.

During thermal oxidation of polysilicon, irregularities corresponding to grains of the polysilicon are formed in the upper surface of the oxide film. As a result, the upper surface 201a of the field insulating in 201 becomes rough, and irregularities with Ra of 0.025 μm to 0.1 μm are formed. In addition, a convex shape is formed at the end 201b of the field insulating film 201. When a silicon material having a corner portion is oxidized, the corner portion becomes acute due to the occurrence of a horn phenomenon during thermal oxidation at about 900° C. However, in thermal oxidation at a high temperature of 1100° C. or more, the viscosity of the oxide film is decreased, and thus the corner portion of the silicon material is deformed to a round shape by the action of surface tension. Therefore, the end 201b of the field insulating film 201 has an outward curve and a convex shape due to thermal oxidation in the modified example.

In addition, a portion of the silicon material 301 is allowed to remain, and thus oxidation of the first region 104 disposed below the field insulating film 201 does not take place except in a region below the end 201b. Therefore, comparing the depth D1 of the first region 104 in a region below the field insulating film 201 with the depth D2 in the cell region A and in a region where the field insulating film 201 is not present in the wiring region B, the relation of D1>D2 can be realized.

The subsequent methods are the same as described above with reference to FIG. 9C and later in the method for manufacturing the semiconductor device 10, and thus description thereof is omitted.

Although, in the embodiment, a metal-insulator-semiconductor field effect transistor (MISFET) having a inversion-type channel structure is described, MISFET having an accumulation channel structure and a trench-type MISFET can be manufactured in the same configuration.

Further, not only MISFET but also various semiconductor devices in which an electrode is disposed on a semiconductor layer with an insulating film provided therebetween can be manufactured by the same method. For example, IGBT can be formed by forming a semiconductor layer directly on a substrate, the semiconductor layer and the substrate having different conductivity types.

In the embodiment, an example in which the substrate 101 is composed of 4H-SiC, and the semiconductor layer 120 is formed on a (0001) Si plane is described. However, the semiconductor layer 120 may be formed on a (000-1) C plane, and the drain electrode may be formed on a (0001) Si plane. In addition, the surface orientation of the main surface may be another crystal surface orientation. Further, another polytype SiC substrate can be used.

Although, in the embodiment, the semiconductor device using SiC is described, the embodiment can be applied to a semiconductor device using silicon.

The semiconductor device and the method for manufacturing the same according to the present disclosure are useful for various semiconductor devices including a power device and methods for manufacturing the devices.

While the present disclosure has been described with respect to preferred embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A semiconductor device comprising:
   a substrate on which a cell region and a wiring region are defined;
   a semiconductor layer disposed on a main surface of the substrate;
   a gate insulating film disposed on the semiconductor layer in the cell region;
   a gate electrode disposed on the gate insulating film;
   a field insulating film disposed on the semiconductor layer in the wiring region; and
   a gate wire partially disposed on the field insulating film and electrically connected to the gate electrode,
   wherein the field insulating film is thicker than the gate insulating film;
   an end of the field insulating film has a convex shape in a cross section perpendicular to the main surface of the substrate; and
   an upper surface of the field insulating film is rougher than an upper surface of a portion of the gate wire below which the field insulating film is not disposed.

2. The semiconductor device according to claim 1, wherein the upper surface of the field insulating film has a centerline average roughness within a range of 0.025 μm to 0.1 μm.

3. The semiconductor device according to claim 1,
   wherein the field insulating film includes:
   a first insulating film disposed on the semiconductor layer and composed of polysilicon; and
   a second insulating film disposed on the first insulating film and composed of silicon oxide.

4. The semiconductor device according to claim 1,
   wherein in the cross section perpendicular to the main surface of the substrate,
   an angle formed by the upper surface of the semiconductor layer and a tangent line to the upper surface of the field insulating film at a point where the upper surface of the field insulating film is in contact with the semiconductor layer is 80° or more and less than 90°; and
   an angle formed by a center line of the upper surface of the field insulating film and a tangent line to the upper surface of the field insulating film at a point where the upper surface of the field insulating film in the end of the field insulating film crosses the center line is 5° or more and 30° or less.

5. The semiconductor device according to claim 1, wherein the gate electrode and the gate wire are composed of polysilicon.

6. The semiconductor device according to claim 1, wherein the semiconductor layer is composed of silicon carbide.

7. The semiconductor device according to claim 1, wherein the thickness of the field insulating film is 3 to 6 times more than the thickness of the gate insulating film.

8. The semiconductor device according to claim 3, wherein the thickness of the second insulating film of the field insulating film is 4 to 6 times more than the thickness of the gate insulating film.

9. The semiconductor device according to claim 1,
   wherein the semiconductor layer includes, in the wiring region, a first impurity region of a first conductivity type and a second impurity region of a second conductivity type that is disposed on the first impurity region;

the gate insulating film is disposed between the second impurity region and the portion of the gate wire below which the field insulating film is not disposed; and in the cross section perpendicular to the main surface of the substrate, the thickness D1 of the second impurity region below the field insulating film and the thickness D2 of the second impurity region below the gate insulating film have the relation of D1>D2.

\* \* \* \* \*